United States Patent
Wittkopf et al.

(10) Patent No.: US 11,307,683 B2
(45) Date of Patent: Apr. 19, 2022

(54) TOUCH-SENSITIVE ILLUMINATING DISPLAY

(71) Applicant: HEWLETT-PACKARD DEVELOPMENT COMPANY, L.P., Houston, TX (US)

(72) Inventors: Jarrid Wittkopf, Palo Alto, CA (US); Robert Ionescu, Palo Alto, CA (US); Ning Ge, Palo Alto, CA (US); Helen A Holder, Palo Alto, CA (US)

(73) Assignee: Hewlett-Packard Development Company, L.P., Spring, TX (US)

(*) Notice: Subject to any disclaimer, the term of this patent is extended or adjusted under 35 U.S.C. 154(b) by 845 days.

(21) Appl. No.: 16/075,637

(22) PCT Filed: Jan. 31, 2017

(86) PCT No.: PCT/US2017/015785
§ 371 (c)(1),
(2) Date: Aug. 4, 2018

(87) PCT Pub. No.: WO2018/143926
PCT Pub. Date: Aug. 9, 2018

(65) Prior Publication Data
US 2021/0200370 A1 Jul. 1, 2021

(51) Int. Cl.
*G06F 3/041* (2006.01)
*G06F 3/044* (2006.01)
*H03K 17/96* (2006.01)

(52) U.S. Cl.
CPC .......... *G06F 3/0412* (2013.01); *G06F 3/0414* (2013.01); *G06F 3/0447* (2019.05);
(Continued)

(58) Field of Classification Search
CPC .... G06F 3/0414; G06F 3/0447; G06F 3/0412; G06F 2203/04103; G06F 2203/04105; H03K 17/962; H03K 2217/96079
See application file for complete search history.

(56) References Cited

U.S. PATENT DOCUMENTS

| 4,532,395 A | 7/1985 | Zukowski |
| 2007/0257821 A1* | 11/2007 | Son ..................... G06F 3/0446 341/22 |

(Continued)

FOREIGN PATENT DOCUMENTS

| EP | 2026180 A2 | 2/2009 |
| WO | 8804467 A1 | 6/1988 |

(Continued)

OTHER PUBLICATIONS

Touch Responsive Electroluminescent Loudspeaker, < http://www.light-touch-matters-project.eu/blog-dettaglio.php?id_post=13 > Dec. 16, 2013.

(Continued)

*Primary Examiner* — Afroza Chowdhury
(74) *Attorney, Agent, or Firm* — Dierker & Kavanaugh PC

(57) ABSTRACT

In an example implementation, a touch-sensitive illuminating display includes a transparent flexible touch layer, a transparent top conductive layer adjacent the flexible touch layer, a bottom conductive layer, and an electroluminescent layer and variable-thickness dielectric layer sandwiched between the top and bottom conductive layers. Pressure against the flexible touch layer is to reduce the dielectric layer thickness and bring the top and bottom conductive layers closer together, causing the electroluminescent layer to emit light where the pressure is applied.

14 Claims, 3 Drawing Sheets

(52) U.S. Cl.
CPC . *H03K 17/962* (2013.01); *G06F 2203/04103* (2013.01); *G06F 2203/04105* (2013.01); *H03K 2217/96079* (2013.01)

(56) References Cited

U.S. PATENT DOCUMENTS

| | | | |
|---|---|---|---|
| 2009/0090611 A1 | 4/2009 | Zeijlon | |
| 2012/0272751 A1* | 11/2012 | Gorjanc | G01L 1/146 |
| | | | 73/862.046 |
| 2014/0211113 A1 | 7/2014 | Defranks | |

FOREIGN PATENT DOCUMENTS

| | | |
|---|---|---|
| WO | 2008046058 A2 | 4/2008 |
| WO | 2009075550 A2 | 6/2009 |

OTHER PUBLICATIONS

Ma, S. et al., Fabrication of Novel Transparent Touch Sensing Device via Drop-on-demand Inkjet Printing Technique, American Chemical Society Appl. Mater. Interfaces, Sep. 21, 2015, pp. 21628-21633, vol. 7, No. 39.

Printing Custom Touch-sensitive Displays Yourself, < https://www.sciencedaily.com/releases/2015/03/150305081132.htm > Mar. 5, 2015.

Karagozler, M.E. et al., Paper Generators: Harvesting Energy from Touching, Rubbing and Sliding, CHI '14 Extended Abstracts on Human Factors in Computing Systems, Apr. 26, 2014-May 1, 2014, pp. 161-162.

Olberding, S. et al., Printscreen: Fabricating Highly Customizable Thin-film Touch-displays, Proceedings of the 27th annual ACM symposium on User interface software and technology, Oct. 7, 2014, pp. 281-290.

* cited by examiner

TOUCH-SENSITIVE ILLUMINATING DISPLAY

BACKGROUND

Touch activated screens are often used with visual displays to form input/output devices on advanced electronic devices such as smart phones, tablet computers, and other processing devices. A touch activated screen enables user control of the device through hand gestures such as tapping and sliding fingers. Most touch activated screens use transparent touch screens over some type of display screen, such as an LED or LCD display screen. Because these types of touch activated screens can have high production costs, they generally capture the high end of the electronic device market. However, such touch activated screens are mostly too cost intensive to be applicable to lower end applications such as consumable packaging.

BRIEF DESCRIPTION OF THE DRAWINGS

Examples will now be described with reference to the accompanying drawings, in which.

Throughout the drawings, identical reference numbers designate similar, but not necessarily identical, elements.

DETAILED DESCRIPTION

Figure 1:
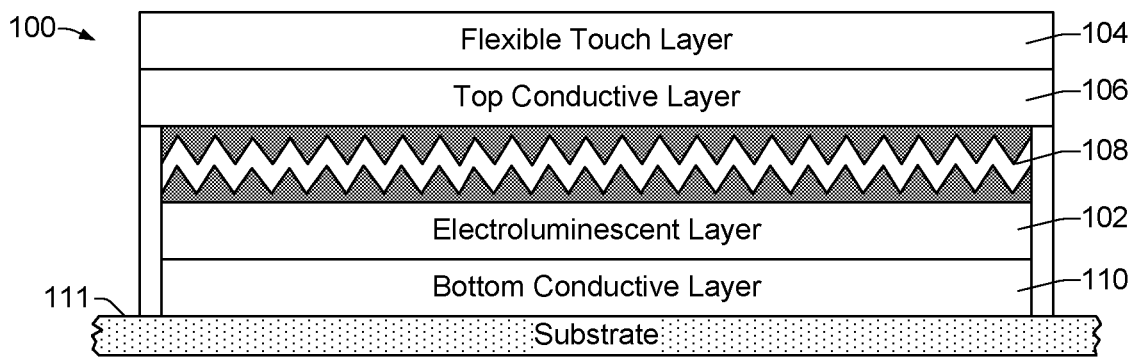
FIG. 1 shows an example of a touch-sensitive illuminating display.

Various consumer product applications can incorporate the use of touch activated displays (referred to herein alternately as touch sensitive displays, touch sensitive illuminating displays, touch activated screens, touch sensitive screens, etc.). For example, touch activated displays can be incorporated into high-end electronic devices, low-cost electronic devices, interactive educational tools, flexible smart packaging, and so on. However, current production techniques for manufacturing touch activated displays are expensive and can be difficult to implement for certain product applications, such as where the product application involves flexible substrates. In general, the high cost and technological limitations associated with manufacturing touch activated displays for various product applications have impeded the full market implementation of touch activated displays.

As noted above, one example application for touch activated displays is in the area of flexible smart packaging. Product packaging can be made of flexible materials for a number of reasons, such as helping to reduce packaging costs, facilitating the ease of product shipping, accommodating varying product shapes and sizes, and so on. Smart packaging can improve and extend the general functionality of product labeling by going beyond the printed label information. Smart packaging can enable additional functionality such as providing information about package conditions, product attributes, and shipping environments, as well as providing detailed package surveillance and tracking information. Various technologies are available for implementing smart packaging, such as RFID (Radio Frequency identification), for example. RFID chips can be used on packaging and packaging labels to track packages during shipment, record package conditions during shipment such as temperature history, determine whether packaged products are counterfeit, and so on. The incorporation of touch activated displays into smart packaging can provide similar benefits such as package authentication, package delivery confirmation, verification of recipient identification, and so on. However, as noted above, the fabrication of touch activated displays onto flexible substrates for implementation in low-cost products has not been cost effective due in part to technological challenges related to the manufacture and implementation of such displays.

Accordingly, examples of a touch-sensitive illuminating display described herein can be fabricated onto various substrates including flexible substrates using cost effective production techniques enabled by printed electronics. A touch-sensitive illuminating display fabricated using any of a number of available printed electronics production techniques comprises an interactive, printable smart device that can be incorporated into packaging, brochures, interactive toys, educational tools, and so on. Examples of touch-sensitive illuminating displays include electroluminescent devices created by printing a bottom or lower conductive layer, an electroluminescent layer, a touch-sensitive dielectric layer, a top or upper conductive layer, and a flexible touch screen. In some examples, the materials for each layer of the display can be processed into jettable fluids, such as jettable inks for printing from a thermal inkjet or piezo inkjet printing device.

By incorporating a touch-sensitive dielectric material layer, certain areas of a touch-sensitive illuminating display can be illuminated on contact. The touch-sensitive dielectric material can be activated when pressure or heat is applied, for example, through physical contact on the flexible touch screen. Activation of the touch-sensitive dielectric material strengthens an electric field flowing through the electroluminescent layer in the area of the contact. The strengthened electronic field excites electrons within the electroluminescent layer which creates light in the area of the contact.

Contact pressure applied to the flexible touch screen can compress the touch-sensitive dielectric layer, bringing the upper and lower conductive layers in close proximity to one another and activating the dielectric layer. The increased proximity of the conductive layers causes the electric field supported by the dielectric to strengthen across the electroluminescent layer in the localized area where the contact pressure is applied. Activation of the touch-sensitive dielectric material can be reversible to provide for multiple illumination events, or irreversible to provide for a single illumination event that keeps the touch-sensitive display illuminated permanently. The material makeup of the touch-sensitive dielectric layer (e.g., the elasticity of the dielectric material), and/or the application of adhesives or epoxy materials to certain layers of the display device, can control the length of time the dielectric material remains compressed after contact pressure is applied. Epoxy materials can be processed and applied to provide both permanent and temporary bonding of the layers to help control the amount of time the touch-sensitive display is illuminated.

In a particular example, a touch-sensitive illuminating display includes a transparent flexible touch layer and a transparent top conductive layer adjacent to the flexible touch layer. The display also includes a bottom conductive layer. An electroluminescent layer and a variable-thickness dielectric layer are sandwiched between the top and bottom conductive layers. Pressure against the flexible touch layer is to reduce the dielectric layer thickness and bring the top and bottom conductive layers closer together, causing the electroluminescent layer to emit light where the pressure is applied.

In another example, a method of forming a touch-sensitive illuminating display includes applying a lower conductive layer onto a substrate, applying an electroluminescent layer over the lower conductive layer, applying a touch-sensitive dielectric layer over the electroluminescent layer, applying an upper conductive layer over the touch-sensitive dielectric layer, and applying a flexible touch-sensitive layer over the upper conductive layer. In some examples, layers of the touch-sensitive illuminating display can be applied with an inkjet printing device patterning jettable solutions of the different layer materials onto the substrate.

In another example, a touch-sensitive illuminating display includes an electroluminescent layer between a top conductive layer and a bottom conductive layer. A current source is to provide current through the top and bottom conductive layers to generate an electric field. A transparent flexible touch layer is to receive contact pressure. The display also includes a compressible touch-sensitive dielectric layer adjacent to the electroluminescent layer to increase the electric field strength in response to the contact pressure, and to cause the electroluminescent layer to emit light in areas of the increased electric field strength where the contact pressure is applied.

Referring now to FIG. 1, an example of a touch-sensitive illuminating display 100 is shown. An example touch-sensitive illuminating display 100 comprises a layered device that emits radiation from an electroluminescent (EL) material layer 102 in the form of visible light (i.e., photons), as discussed in more detail herein below. In one example arrangement, the layers of the touch-sensitive illuminating display 100 include a flexible touch layer 104, an upper or top conductive layer 106, a touch-sensitive dielectric layer 108, the EL layer 102, and a lower or bottom conductive layer 110. The example touch-sensitive illuminating display 100 can be fabricated on any suitable flexible or inflexible substrate 111 including paper, cardboard, plastic, wood, metal, and so on. As discussed in more detail below, the method of fabrication of the example touch-sensitive illuminating display 100 can include any of several printing technologies used for fabricating printed electronics.

Figure 2:
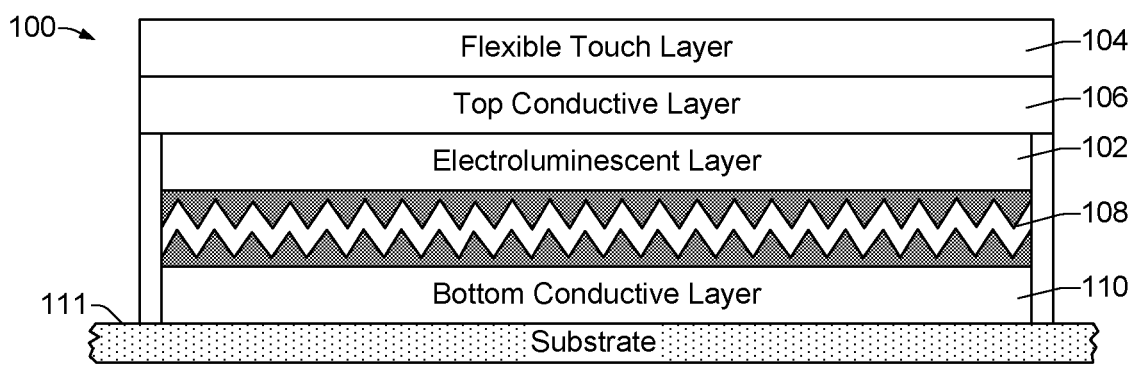
FIG. 2 shows an example of a touch-sensitive illuminating display having an alternate arrangement of layer.

While FIG. 1 shows one arrangement of the layers within the touch-sensitive illuminating display 100, other arrangements are possible. FIG. 2 shows an alternate arrangement of the layers within the touch-sensitive illuminating display 100 in which the touch-sensitive dielectric layer 108 is positioned under the EL layer 102, instead of being positioned above the EL layer 102 as shown in the arrangement of FIG. 1.

A flexible touch layer 104 can include a glass layer that provides flexibility to contact pressure, for example, from a user's finger or a stylus. A glass flexible touch layer 104 can also provide strength, resistance to scratching, and a high degree of transparency to permit the passage of light from the EL layer 102. In some examples, a flexible touch layer 104 can be made of materials other than glass that offer greater or lesser degrees of flexibility, transparency, and strength. Examples of other materials that may be suitable for use in forming the flexible touch layer 104 include sapphire and plastic.

The top conductive layer 106 and bottom conductive layer 110 can include layers made of various types of metal or other conductive materials. In particular, however, the top conductive layer 106 comprises a transparent material that enables light from the EL layer 102 to penetrate through to the flexible touch layer 104. In some examples, the top conductive layer 106 and the bottom conductive layer 110 can comprise a transparent conducting film (TCF) made from an electrically conductive and optically transparent material. Examples of such electrically conductive and optically transparent materials include indium tin oxide (ITO), fluorine doped tin oxide (FTO), and doped zinc oxide. Other examples of transparent conducting films can include carbon nanotube networks, graphene, and networks of polymers such as poly (3,4-ethylenedioxythiophene).

The touch-sensitive dielectric layer 108 comprises a dielectric material to support an electric field between the top conductive layer 106 and bottom conductive layer 110. The jagged edges shown in the touch-sensitive dielectric layer 108 of the display 100 are intended to illustrate a degree of compressibility of the dielectric layer 108, as well as to indicate a potential dielectric material that comprises air or another gas. In this respect, the dielectric layer 108 can be said to have a thickness that may vary, for example, in response to contact pressure applied to the flexible touch layer 104. The dielectric properties of the dielectric layer 108 can fluxgate depending on the applied pressure to this layer. In some examples, as shown in FIGS. 1, 3, 5, and 6, the dielectric layer 108 can be positioned above the EL layer 102. In these examples, the dielectric layer 108 comprises a transparent dielectric material that enables the passage of light from the EL layer 102.

Figure 3:
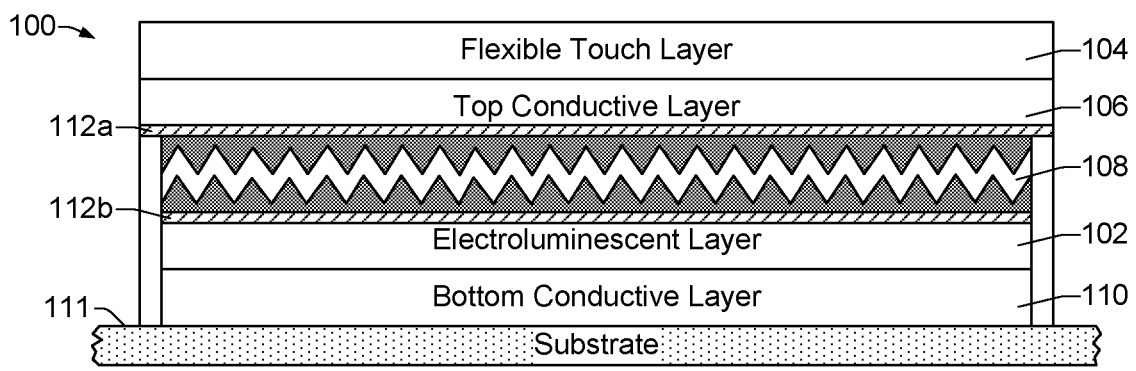
FIGS. 3 and 4 show examples of touch-sensitive illuminating displays where an adhesive is applied to layers of the display.
Figure 4:
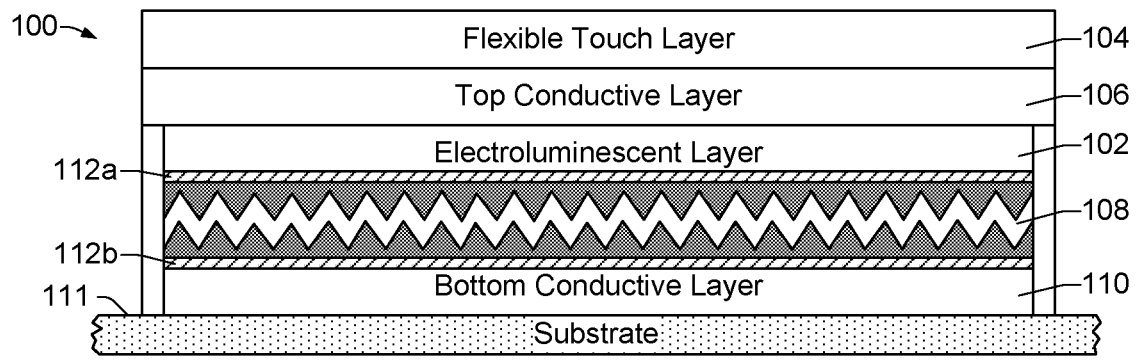

As shown in FIGS. 3 and 4, an adhesive 112 (illustrated as 112a and 112b) such as an epoxy material can be applied to layers of the touch-sensitive illuminating display 100. In some examples the adhesive comprises thermally activated epoxy materials. The two components of the epoxy (i.e., 112a and 112b) can be applied to the sides of certain layers within the display 110 to provide a permanent or temporary bonding effect between the epoxied layers. For example, referring to FIG. 3, a first component of an epoxy 112a can be applied to the top side of the dielectric layer 108 while a second component of the epoxy 112b can be applied to the top side of the EL layer 102. Because the layers of the display 100 can be fabricated in a printing process that builds the layers up on a substrate 111 starting with the bottom conductive layer 110, the epoxy 112 can be applied onto the top side of a layer after the layer has been formed.

Referring now to the alternate layer arrangement shown in FIG. 4 where the EL layer 102 is on top of the dielectric layer 108, the first component of the epoxy 112a can be applied to the top side of the dielectric layer 108, and the second component of the epoxy 112b can be applied to the top side of the bottom conductive layer 110. In either of the arrangements shown in FIGS. 3 and 4, the components of the epoxy 112 can be brought together to bond with one another when enough contact pressure is applied to the flexible touch layer 104 of the touch-sensitive illuminating display 100. As discussed below, such bonding can be temporary or permanent to enable a temporary or permanent light emission from the electroluminescent layer 102.

In some examples, the touch-sensitive dielectric layer 108 can comprise a porous dielectric layer. In such examples an epoxy 112 may not be present on any of the layers within the display 100. Instead, the elastic properties of the porous dielectric material layer can provide a time frame during which the dielectric layer 108 remains compressed after sufficient contact pressure is applied to the flexible touch layer 104 of the touch-sensitive illuminating display 100. A porous dielectric layer 108 may comprise a composite dielectric consisting of a porous polymer structure such as PS (polysulfide) infilled with PMMA (Poly(methyl methacrylate)) or PVP (Polyvinylpyrrolidone) dielectric materials. The amount of time the dielectric layer 108 can remain compressed depends on the elastic properties of the dielectric materials. Thus, the amount of time the display 100 emits light from the electroluminescent layer 102 can be adjusted.

Figure 5:
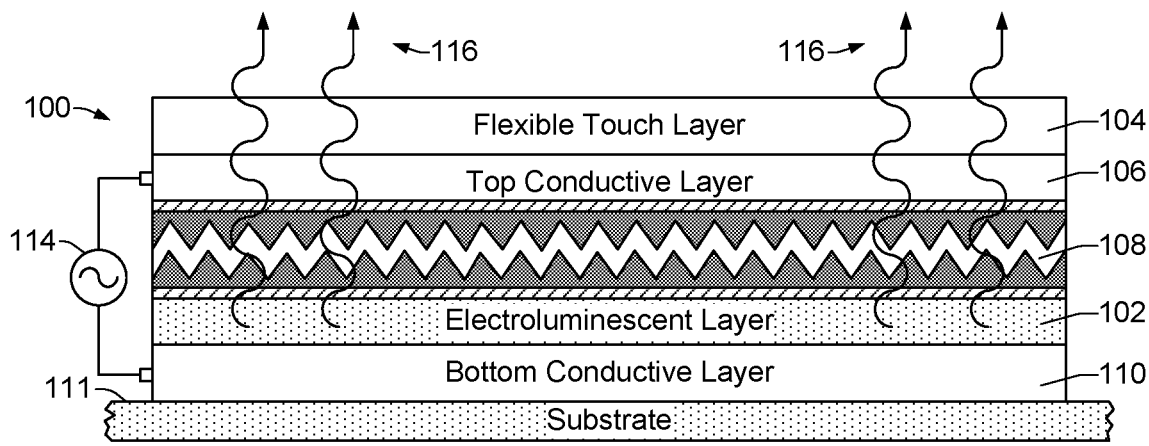
FIGS. 5, 6, and 7, show examples of touch-sensitive illuminating displays in which light is being emitted from an electroluminescent layer.
Figure 6:
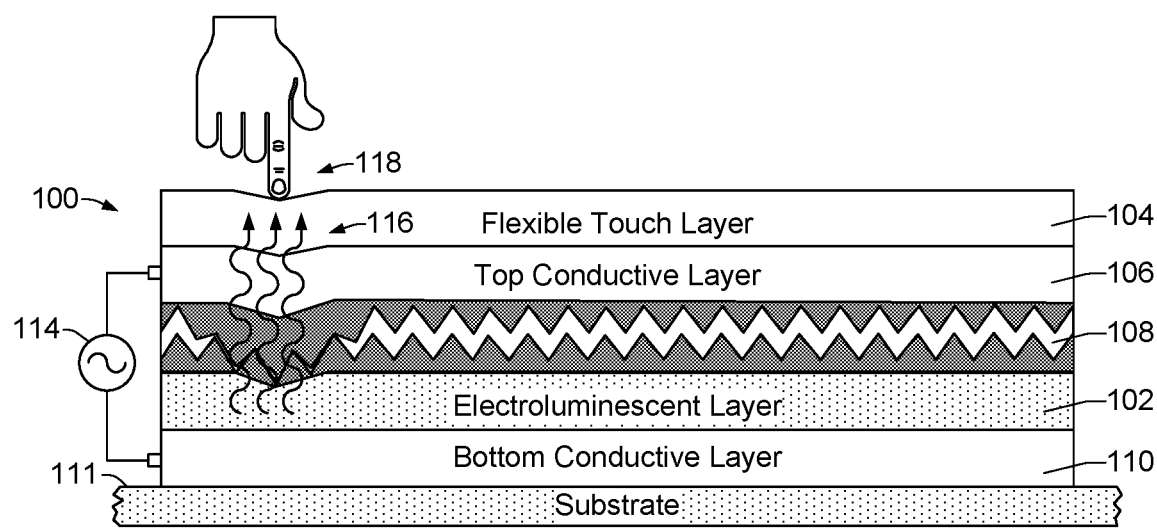
Figure 7:
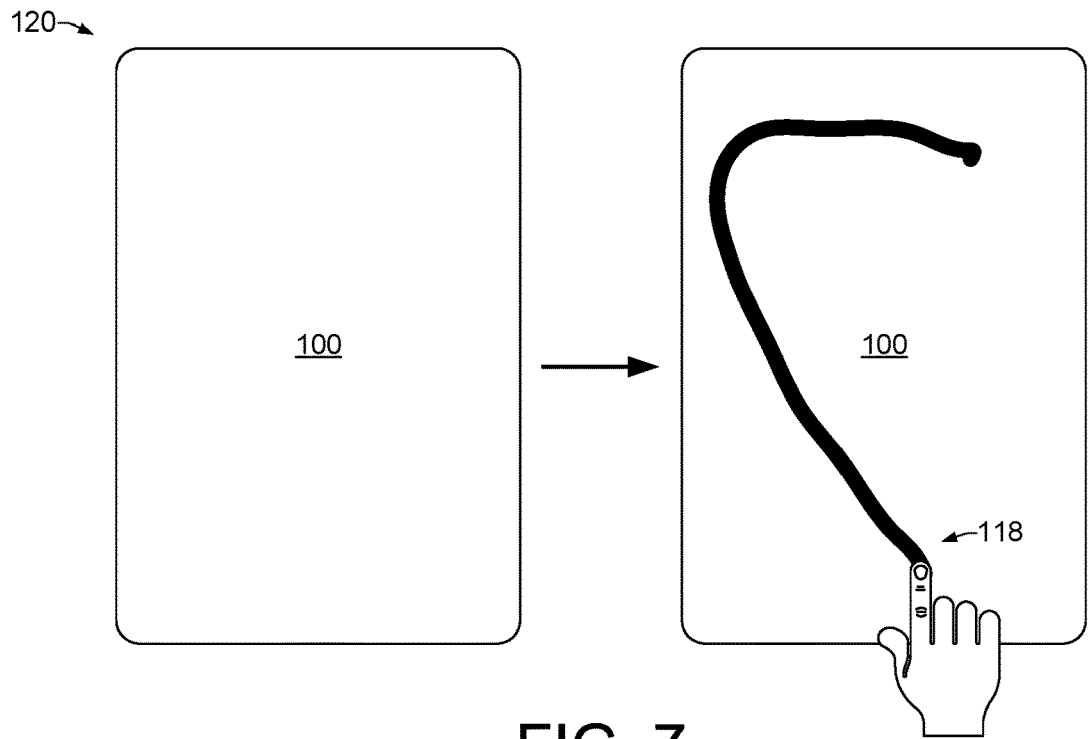

FIGS. 5, 6, and 7, show examples of the touch-sensitive illuminating display 100 in which light 116 is being emitted from the electroluminescent layer 102. In general, as shown in FIG. 5, current from a source 114 flowing through the top conductive layer 106 and bottom conductive layer 110 generates an electric field. While an AC current source 114 is shown in the examples of FIGS. 5 and 6, other examples may implement a DC source. The electroluminescent layer 102 comprises electroluminescent material that can emit light 116 (i.e., photons) in the presence of the electric field when the electric field is strong enough. The illumination is caused by the excitement of electrons in the electroluminescent phosphoring layer 102 in the presence of the electric field. Incorporation of the touch sensitive dielectric material layer 108 enables certain areas of the electroluminescent layer 102 to illuminate when contact pressure is applied to the flexible touch layer 104.

The electroluminescent layer 102 comprises electroluminescent material that can include organic or inorganic materials. In general, the materials can include semiconductor materials that have a wide bandwidth that permits light to exit the material. In some examples, the electroluminescent material can comprise zinc sulfide (ZnS) with copper dopants to emit green light. Other examples of dopants can include silver which produces a blue light and manganese which can produce an orange/red color. In different examples, the entire electroluminescent layer 102 can be doped with a particular dopant to cause a particular color of light to be emitted. In some examples, different regions of the electroluminescent layer 102 can be doped with different dopants to enable each region to emit a different color of light.

Referring to FIG. 6, when contact pressure 118 is applied to the flexible touch layer 104, the touch-sensitive dielectric layer 108 can compress in the areas where the contact pressure is applied. FIG. 7 shows an example of a touch-sensitive illuminating display 100 that has been incorporated into an example product 120, such as a smart packaging product or an interactive toy product. The example in FIG. 7 is intended to provide a simple illustration of how a touch-sensitive illuminating display 100 can be implemented in an example product 120 and how it can function. Referring to FIGS. 6 and 7, compression of the dielectric layer 108 brings the top conductive layer 106 and bottom conductive layer 110 closer together and strengthens the electric field flowing between them through the electroluminescent layer 102. As the electric field strengthens, electrons within the electroluminescent layer 102 are excited and can release energy as photons/light 116. Depending on the properties of an applied epoxy 112 onto layers of the display 100, or alternatively, the elastic properties of the dielectric layer 108, the dielectric layer 108 can remain compressed for a temporary period of time or it can remained compressed permanently. The properties of the applied epoxy 112 or the elastic properties of the dielectric layer 108 itself can therefore be manipulated to control the amount of time that the touch-sensitive illuminating display 100 continues to emit light in those areas where contact pressure 118 has been applied to the flexible touch layer 104.

As noted above, an example touch-sensitive illuminating display 100 can be fabricated on any suitable flexible or inflexible substrate 111 including paper, cardboard, plastic, wood, metal, and so on. Furthermore, the method of fabrication of the example touch-sensitive illuminating display 100 can include any of several printing technologies used for fabricating printed electronics. In general, different printing technologies that enable the formation or printing of patterns onto various substrates may be appropriate. Such printing technologies can include, for example, inkjet printing (thermal and piezo) screen printing, flexography, gravure, and offset lithography. Thus, while inkjet printing is used in the present example as a technology for fabricating a touch-sensitive illuminating display 100, other printing technologies are possible and are contemplated herein.

The use of inkjet printing for fabricating a touch-sensitive illuminating display 100 involves the processing of the materials for each layer into a jettable solution or fluid. Such solutions are generally commercially available solutions, and they are processed to meet certain standards for viscosity, pigment particle size, surface energy, and solid concentration percentage. A process for printing a touch-sensitive illuminating display 100 can be similar to printing text and graphics onto a printable media such as sheet or roll paper in which ink or other jettable solutions can be applied in layers and can be layered on top of one another.

Figure 8:
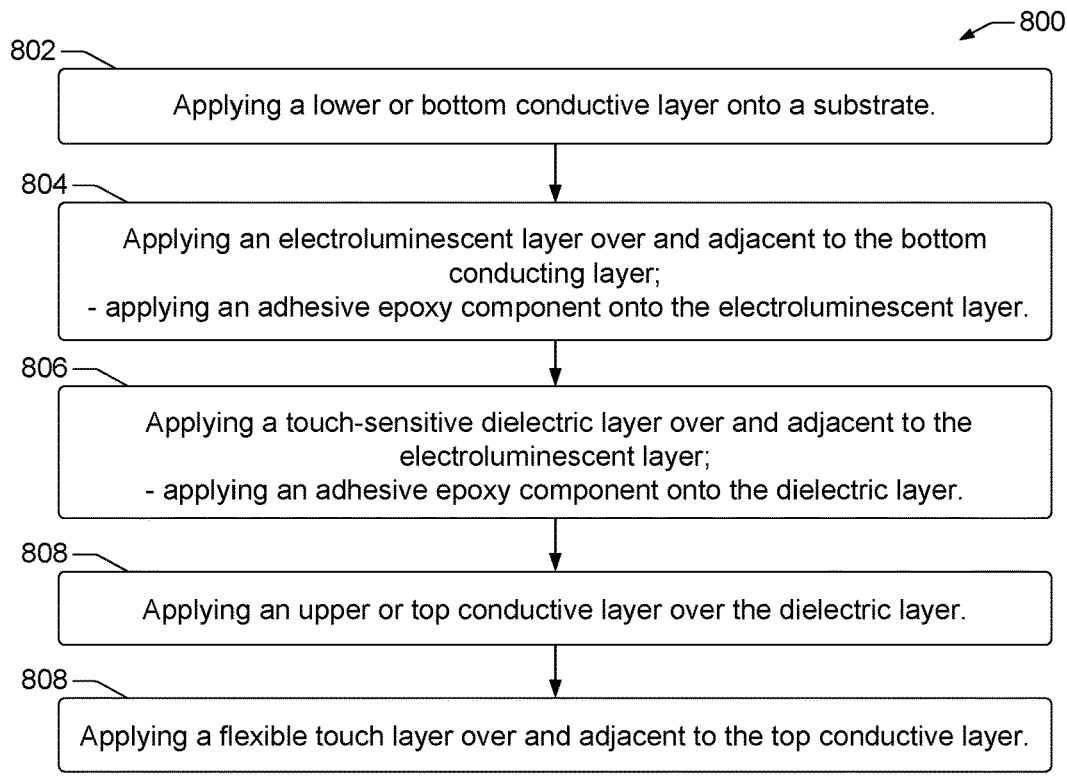
FIG. 8 shows a flow diagram that illustrates an example method of forming a touch-sensitive illuminating display.

FIG. 8 shows a flow diagram that illustrates an example method 800 of forming a touch-sensitive illuminating display. Method 800 is associated with examples discussed above with regard to FIGS. 1-7, and details of the operations shown in method 800 can be found in the related discussion of such examples. In some examples, implementing the operations of method 800 can be achieved by an inkjet printing device programmed to deposit processed solutions in controlled patterns onto a substrate 111 to form each layer of the touch-sensitive illuminating display, one layer after another.

The method 800 may include more than one implementation, and different implementations of method 800 may not employ every operation presented in the flow diagram of FIG. 8. Therefore, while the operations of method 800 are presented in a particular order within the flow diagram, the order of their presentation is not intended to be a limitation as to the order in which the operations may actually be implemented, or as to whether all of the operations may be implemented. For example, one implementation of method 800 might be achieved through the performance of a number of initial operations, without performing some of the subsequent operations, while another implementation of method 800 might be achieved through the performance of all of the operations.

Referring now to the flow diagram of FIG. 8, an example method 800 of forming a touch-sensitive illuminating display can begin at block 802, with applying a lower or bottom conductive layer onto a substrate. As shown at block 804, an electroluminescent layer can be applied over and adjacent to the bottom conducting layer. In some examples, an adhesive epoxy component can be applied onto the electroluminescent layer. A touch-sensitive dielectric layer can then be applied over and adjacent to the electroluminescent layer, as shown in block 806. In some examples an adhesive epoxy component can also be applied onto the dielectric layer. In some examples, an alternative arrangement of the layers can be applied wherein the dielectric layer is first applied over and adjacent to the bottom conductive layer, followed by application of the electroluminescent layer over and adjacent to the dielectric layer. As shown at block 808, an upper or top conductive layer can be applied over the dielectric layer, or the electroluminescent layer, depending on the order of application of the dielectric layer and electroluminescent layer as discussed above. As shown at block 810, a flexible touch layer can then be applied over and adjacent to the top conductive layer.

What is claimed is:

1. A touch-sensitive illuminating display comprising:
   a transparent flexible touch layer;
   a transparent top conductive layer below and adjacent the flexible touch layer and whose entire surface is conductive;
   a bottom conductive layer whose entire surface is conductive;
   an electroluminescent layer and a variable-thickness compressible dielectric layer sandwiched between the top and bottom conductive layers; and,
   a compression time control adhesive applied to the electroluminescent layer and one of the conductive layers to control an amount of time the dielectric layer remains compressed after pressure is applied against the flexible touch layer.

2. A display as in claim 1, further comprising:
   a voltage source coupled between the top and bottom conductive layers to generate an electric field through the dielectric layer, wherein the electric field becomes strong enough to cause the electroluminescent layer to emit light when the pressure is applied.

3. A display as in claim 1, wherein:
   the electroluminescent layer is positioned adjacent to the top conductive layer and the dielectric layer is positioned between the electroluminescent layer and the bottom conductive layer.

4. A display as in claim 3, wherein the adhesive comprises:
   a permanent dielectric layer thickness reducing adhesive applied to the electroluminescent layer and to the bottom conductive layer to permanently bond the electroluminescent layer and the bottom conductive layer through a permanently reduced thickness of the dielectric layer where and when the pressure is applied.

5. A display as in claim 1, wherein:
   the electroluminescent layer is positioned adjacent to the bottom conductive layer and the dielectric layer is positioned between the electroluminescent layer and the top conductive layer; and
   the dielectric layer comprises a transparent dielectric layer.

6. A display as in claim 5, wherein the adhesive comprises:
   a temporary dielectric layer thickness reducing adhesive applied to the electroluminescent layer and to the top conductive layer to temporarily bond the electroluminescent layer with the top conductive layer through a temporarily reduced thickness of the dielectric layer in areas where the pressure is applied to the transparent flexible touch layer.

7. A display as in claim 4, wherein the adhesive comprises a temporary dielectric layer thickness reducing adhesive comprising a temporary epoxy to create a temporary bond between the electroluminescent layer and the bottom conductive layer, the temporary bond enabling the electroluminescent layer to emit light temporarily where the pressure is applied to the transparent flexible touch layer.

8. A display as in claim 4, wherein the adhesive comprises a permanent epoxy to create a permanent bond between the electroluminescent layer and the bottom conductive layer, the permanent bond enabling the electroluminescent layer to emit light continuously where the pressure is applied to the transparent flexible touch layer.

9. A display as in claim 1, wherein the dielectric layer comprises a porous dielectric layer comprising elastic properties enabling the dielectric layer to remain compressed for a controllable period of time upon application of pressure against the flexible touch layer.

10. A touch-sensitive illuminating display comprising:
    an electroluminescent layer between a top conductive layer and a bottom conductive layer;
    a current source to provide current through the top and bottom conductive layers to generate an electric field;
    a transparent flexible touch layer to receive contact pressure;
    a compressible touch-sensitive dielectric layer adjacent to the electroluminescent layer to increase the electric field strength in response to the contact pressure and to cause the electroluminescent layer to emit light in areas of the increased electric field strength where the contact pressure is applied; and,
    a compression time control adhesive applied to the electroluminescent layer and one of the conductive layers to control an amount of time the dielectric layer remains compressed after the contact pressure is applied against the flexible touch layer.

11. A display as in claim 10, wherein:
    the compression time control adhesive is to create a temporary bond to hold the electroluminescent layer and bottom conductive layer together for a temporary period of time in response to compression of the touch-sensitive dielectric layer.

12. A method of forming a touch-sensitive illuminating display comprising:
    applying conductive material onto a substrate forming a lower conductive layer whose entire surface is conductive;
    applying an electroluminescent layer over and adjacent to the lower conductive layer;
    applying a touch-sensitive dielectric layer over and adjacent to the electroluminescent layer;
    applying over and adjacent to the touch-sensitive dielectric layer, an upper conductive layer whose entire surface is conductive;
    applying a flexible touch-sensitive layer over and adjacent to the upper conductive layer;
    applying a first component of an epoxy to the electroluminescent layer; and,
    applying a second component of an epoxy to the touch-sensitive dielectric layer;
    wherein upon application of contact pressure to the flexible touch-sensitive layer, the first and second components activate and comprise a compression time control adhesive to control an amount of time the dielectric layer remains compressed after the contact pressure is applied against the flexible touch layer.

13. A method as in claim 12, wherein:
    applying a touch-sensitive dielectric layer comprises applying the touch-sensitive dielectric layer over the lower conductive layer prior to applying the electroluminescent layer;
    applying the electroluminescent layer comprises applying the electroluminescent layer over touch-sensitive dielectric layer; and, applying an upper conductive layer comprises applying the upper conductive layer over the electroluminescent layer.

14. A method as in claim 12, wherein applying each layer comprises printing a material of the layer as a jettable solution from an inkjet printing device.

\* \* \* \* \*